(12) United States Patent
Huang

(10) Patent No.: US 7,482,846 B2
(45) Date of Patent: Jan. 27, 2009

(54) PULL-UP DEVICES

(75) Inventor: Chao-Sheng Huang, Taipei (TW)

(73) Assignee: Via Technologies, Inc., Taipei (TW)

( * ) Notice: Subject to any disclaimer, the term of this patent is extended or adjusted under 35 U.S.C. 154(b) by 189 days.

(21) Appl. No.: 11/610,618

(22) Filed: Dec. 14, 2006

(65) Prior Publication Data

US 2008/0042721 A1 Feb. 21, 2008

(30) Foreign Application Priority Data

Jun. 20, 2006 (TW) ............................ 95122101 A

(51) Int. Cl.
*H03B 1/00* (2006.01)
(52) U.S. Cl. .................................... 327/112; 327/309
(58) Field of Classification Search ................. 327/112, 327/309; 326/30

See application file for complete search history.

(56) References Cited

U.S. PATENT DOCUMENTS

| | | | | |
|---|---|---|---|---|
| 5,357,156 | A * | 10/1994 | Herrington | ................... 327/310 |
| 5,539,327 | A * | 7/1996 | Shigehara et al. | ............. 326/30 |
| 5,631,793 | A * | 5/1997 | Ker et al. | ....................... 361/56 |
| 5,671,111 | A * | 9/1997 | Chen | ............................ 361/56 |
| 5,910,874 | A * | 6/1999 | Iniewski et al. | ................ 361/56 |
| 6,747,501 | B2 * | 6/2004 | Ker et al. | ..................... 327/310 |
| 7,242,559 | B2 * | 7/2007 | An | .............................. 361/56 |

* cited by examiner

*Primary Examiner*—Lincoln Donovan
*Assistant Examiner*—Hai L. Nguyen
(74) *Attorney, Agent, or Firm*—Thomas, Kayden, Horstemeyer & Risley

(57) ABSTRACT

A pull-up device coupled between an input/output (I/O) pad and a core circuit and has a static pull-up circuit, an adjustment unit, and a control circuit. The static pull-up circuit is coupled to the core circuit and receives a supply voltage. The adjustment unit is coupled to the I/O pad and generates an adjustment signal according to an input voltage of the I/O pad. The control circuit is coupled to the adjustment unit and the static pull-up circuit and controls the static pull-up circuit according to the adjustment signal.

18 Claims, 2 Drawing Sheets

PULL-UP DEVICES

BACKGROUND OF THE INVENTION

1. Field of the Invention

The invention relates to a pull-up device, and in particular to a pull-up device capable of receiving an input voltage higher than a power supply voltage.

2. Description of the Related Art

Generally, pull-up circuits or pull-down circuits are disposed in bonding pads of an integrated circuit. When there is no input signal, the pull-up circuits or pull-down circuits are used to keep input voltage of the bonding pads at a predetermined value. Input voltage of the integrated circuit thus maintains at a stable state, and noise does not affect the integrated circuit.

BRIEF SUMMARY OF THE INVENTION

The invention provides a pull-up device is coupled between an input/output (I/O) pad and a core circuit and includes a static pull-up circuit, an adjustment unit, and a control circuit. The static pull-up circuit is coupled to the core circuit and receives a power supply voltage. The adjustment unit is coupled to the I/O pad and generates an adjustment signal according to an input voltage of the I/O pad. The control circuit is coupled to the adjustment unit and the static pull-up circuit and controls the static pull-up circuit according to the adjustment signal.

The invention also provides a pull-up device coupled between an input/output (I/O) pad and a core circuit. The pull-up device includes a first transistor having a drain coupled to the core circuit, a source receiving a power supply voltage, and a gate. An adjustment unit coupled to the I/O pad and generating an adjustment signal according to an input voltage of the I/O pad. And a second transistor having a source receiving the adjustment signal, a gate receiving the power supply voltage, and a drain coupled to the gate of the first transistor.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
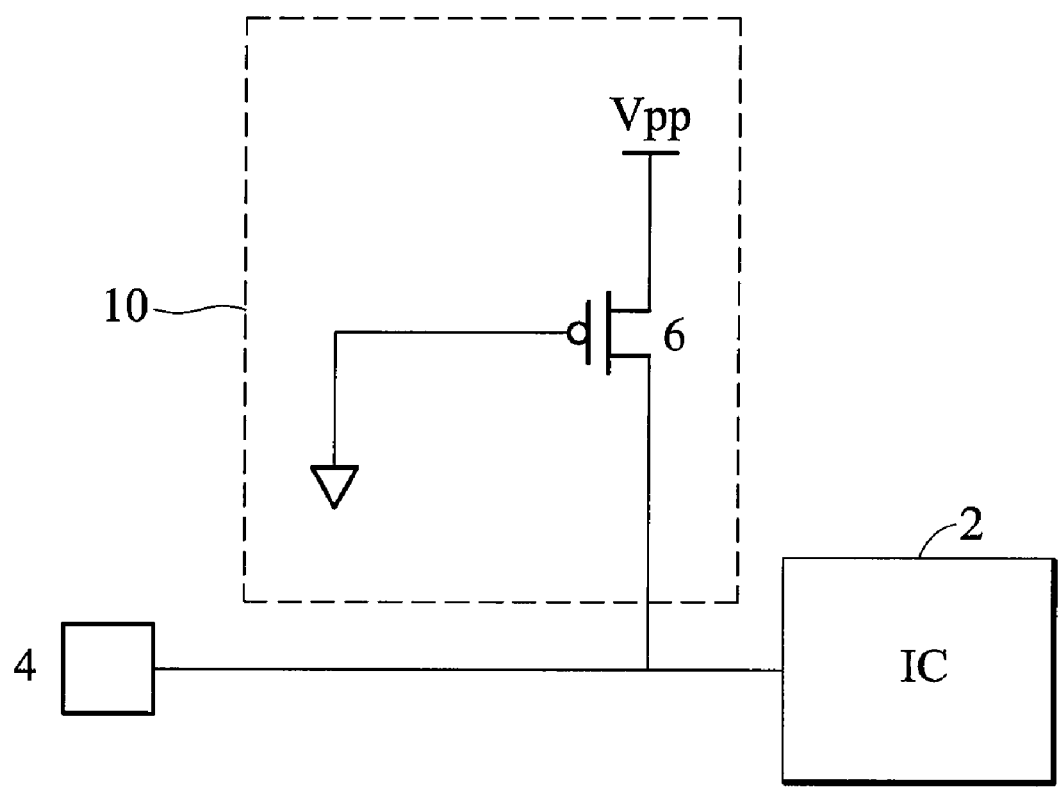
FIG. 1 depicts a pull-up circuit.

FIG. 1 depicts a pull-up circuit. The pull-up circuit 10 is coupled to an integrated circuit (IC) 2 and an input/output (I/O) pad 4 of the IC 2. The IC 2 receives an input signal via the I/O pad 4.

The pull-up circuit 10 includes a PMOS transistor 6. The PMOS transistor 6 has a gate coupled to a ground, a source receiving a power supply voltage $V_{pp}$, and drain coupled to the IC 2 and the I/O pad 4. When the I/O pad 4 is not floating (an input signal is inputted), the PMOS transistor 6 may be turned off. Thus, the pull-up circuit 10 does not affect an input voltage $V_{I/O}$ received by the IC 2 from the I/O pad 4. Even if the PMOS transistor 6 is turned on, the effect for receiving the input voltage $V_{I/O}$ of IC 2 is very weak.

When an input signal is input to the I/O pad 4, the IC 2 can receive the input signal. When there is no input signal on the I/O pad 4, the PMOS transistor 6 is turned on due to the gate of the PMOS transistor 6 coupled to the ground, and a voltage level of a pin, coupled to the I/O pad 4, of the IC 2 is pulled up to the supply voltage $V_{pp}$. Thus, the input voltage $V_{I/O}$ of the IC 2 is fixed at the supply voltage $V_{pp}$, to avoid the noise effect.

However, when the input voltage $V_{I/O}$ is greater than the tolerable voltage (i.e. $V_{pp}$) of the PMOS transistor 6, for example, when the input voltage $V_{I/O}$ of the IC 2 is 0~5V voltage and the supply voltage $V_{pp}$ is 3.3V, drain of the PMOS transistor 6 receives the input signal with 5V. At the same time, because gate-drain voltage $V_{GD}$ of the PMOS transistor 6 is 5V, thus the PMOS transistor 6 is damaged, and the pull-up circuit 10 does not function.

Figure 2:
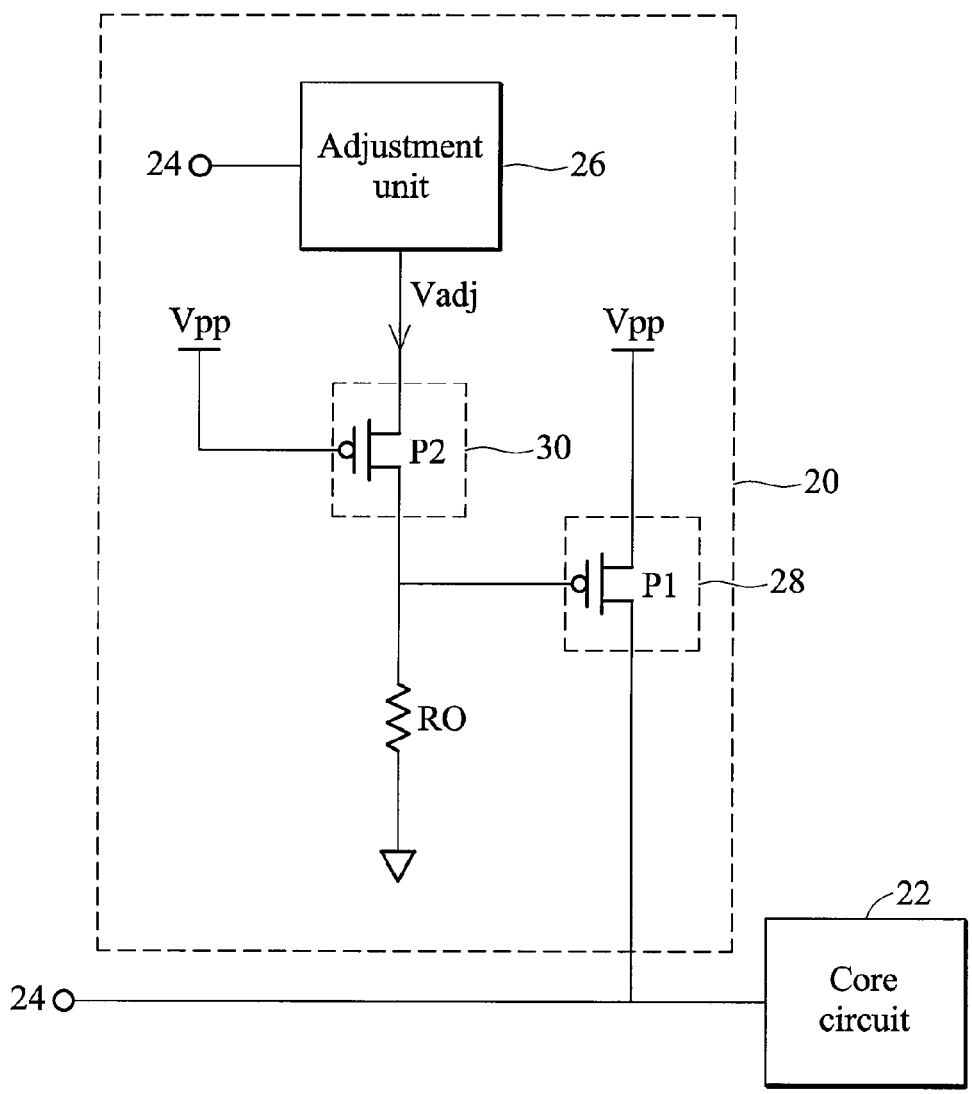
FIG. 2 depicts an exemplary embodiment of a pull-up device.

An exemplary embodiment of a pull-up device of the invention is shown in FIG. 2, which a pull-up device 20 is coupled between an I/O pad 24 and a core circuit 22. The core circuit 22 can be an internal circuit of an IC. Input voltage of the I/O pad 24 is represented as $V_{I/O}$.

The pull-up device 20 includes an adjustment unit 26, a static pull-up circuit 28, and a control circuit 30. The static pull-up circuit 28 has a PMOS transistor P1, and the control circuit 30 has a PMOS transistor P2.

A source of the PMOS transistor P1 receives a supply voltage $V_{PP}$, a gate thereof is coupled between a drain of the PMOS transistor P2 and a resistor R0 with larger resistance, and a drain thereof is coupled between the I/O pad 24 and the core circuit 22. A source of the PMOS transistor P2 is coupled to the adjustment unit 26, a gate thereof receives the supply voltage $V_{PP}$, the drain thereof is coupled to the gate of the PMOS transistor P1. The resistor R0 is coupled between the gate of the PMOS transistor P1 and a ground. The adjustment unit 26 is coupled to the I/O pad 24 and outputs an adjustment signal $V_{adj}$ to the source of the PMOS transistor P2.

When the input voltage $V_{I/O}$ of the I/O pad 24 is between a low voltage and the power supply voltage $V_{PP}$, the adjustment signal $V_{adj}$ is substantially equal to the supply voltage $V_{PP}$.

When the input voltage $V_{I/O}$ is between the power supply voltage $V_{PP}$ and a high voltage, the adjustment signal $V_{adj}$ is substantially equal to the input voltage $V_{I/O}$. The high voltage is the largest voltage of the I/O pad 24.

For example, when the input voltage $V_{I/O}$ of the I/O pad 24 is between 0V (low voltage)~3.3V($V_{PP}$), the adjustment unit 26 generates the adjustment signal $V_{adj}$ with 3.3V. Because the gate-source voltage $V_{GS}$ of the PMOS transistor P2 is 0V, the PMOS transistor is turned off. The effect of the PMOS transistor P1 on the input voltage $V_{I/O}$ of the I/O pad 24 is very weak. Thus, when the input voltage $V_{I/O}$ is in the range tolerated by the PMOS transistor P1, the core circuit 22 directly receives the input voltage $V_{I/O}$ of the I/O pad 24.

When the input voltage $V_{I/O}$ of the I/O pad 24 is between 3V($V_{PP}$)~5V, the adjustment signal $V_{adj}$ generated by the adjustment unit 26 is substantially equal to the input voltage $V_{I/O}$ (3.3V~5V). The PMOS transistor P2 is thus turned on. Because the resistor R0 has a large resistance, gate voltage $V_G$ of the PMOS transistor P1 is pulled up to the input voltage $V_{I/O}$, and gate-drain voltage $V_{GD}$ of the PMOS transistor P1 is 0V. It avoids the damages of the PMOS transistor P1 due to the too greater input voltage $V_{I/O}$.

The pull-up device is capable of receiving the input voltage $V_{I/O}$ higher than the supply voltage $V_{PP}$, for example, the supply voltage $V_{PP}$ is 3V and the input voltage $V_{I/O}$ is 6V, and the supply voltage $V_{PP}$ is 3.3V and the input voltage $V_{I/O}$ is 6V. The voltage range of the supply voltage $V_{PP}$ and the input voltage $V_{I/O}$ can be varied according to system requirements. The adjustment unit 26 can be implemented by a floating N-well.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pull-up device coupled between an input/output (I/O) pad and a core circuit, comprising:
    a static pull-up circuit coupled to the core circuit and receiving a power supply voltage;
    an adjustment unit coupled to the I/O pad and generating an adjustment signal according to an input voltage of the I/O pad; and
    a control circuit coupled to the adjustment unit and the static pull-up circuit and controlling the static pull-up circuit according to the adjustment signal, wherein the control circuit comprises a second PMOS transistor having a source receiving the adjustment signal, a gate receiving the power supply voltage, and a drain coupled to the static pull-up circuit.

2. The pull-up device as claimed in claim 1, wherein the static pull-up circuit comprises a first PMOS transistor having a drain coupled to the core circuit, a source receiving the power supply voltage, and a gate coupled to the control circuit.

3. The pull-up device as claimed in claim 1, wherein the adjustment unit is implemented by a floating N-well.

4. The pull-up device as claimed in claim 1 further comprising a resistor coupled between the drain of the second PMOS transistor and a ground.

5. The pull-up device as claimed in claim 4, wherein the resistor has a larger resistance.

6. The pull-up device as claimed in claim 1, wherein when the input voltage of the I/O pad is between a low voltage and the power supply voltage, the adjustment unit generates the adjustment signal having the same voltage level as the power supply voltage.

7. The pull-up device as claimed in claim 6, wherein the control circuit is turned off, and the core circuit receives the input voltage inputted by the I/O pad.

8. The pull-up device as claimed in claim 1, wherein when the input voltage of the I/O pad is between the power supply voltage and a high voltage, the adjustment unit generates the adjustment signal having the same voltage level as the I/O pad.

9. The pull-up device as claimed in claim 8, wherein the control circuit is turned on to turn on the static pull-up circuit.

10. A pull-up device coupled between an input/output (I/O) pad and a core circuit, comprising:
    a first transistor having a drain coupled to the core circuit, a source receiving a power supply voltage, and a gate;
    an adjustment unit coupled to the I/O pad and generating an adjustment signal according to an input voltage of the I/O pad; and
    a second transistor having a source receiving the adjustment signal, a gate receiving the power supply voltage, and a drain coupled to the gate of the first transistor.

11. The pull-up device as claimed in claim 10, wherein the adjustment unit is implemented by a floating N-well.

12. The pull-up device as claimed in claim 10, wherein further comprising a resistor coupled between the drain of the second transistor and a ground.

13. The pull-up device as claimed in claim 12, wherein the resistor has a larger resistance.

14. The pull-up device as claimed in claim 10, wherein the first and second transistors are PMOS transistors.

15. The pull-up device as claimed in claim 10, wherein when the input voltage of the I/O pad is between a low voltage and the power supply voltage, the adjustment unit generates the adjustment signal having the same voltage level as the power supply voltage.

16. The pull-up device as claimed in claim 15, wherein the second transistor is turned off, and the core circuit receives the input voltage input by the I/O pad.

17. The pull-up device as claimed in claim 10, wherein when the input voltage of the I/O pad is between the power supply voltage and a high voltage, the adjustment unit generates the adjustment signal having the same voltage level as the I/O pad.

18. The pull-up device as claimed in claim 17, wherein the second transistor circuit is turned on to turn on the first transistor, and the voltage difference between the gate and drain of the first transistor is 0V.

* * * * *